United States Patent [19]
Krueger et al.

[11] Patent Number: 6,043,966
[45] Date of Patent: *Mar. 28, 2000

[54] PRINTED CIRCUIT BOARD ASSEMBLY HAVING AN INTEGRATED FUSIBLE LINK

[75] Inventors: David J Krueger, Arlington Ht; Andrew J. Neuhalfen, Algonquin, both of Ill.

[73] Assignee: Littelfuse, Inc., Des Plaines, Ill.

[*] Notice: This patent is subject to a terminal disclaimer.

[21] Appl. No.: 09/311,016

[22] Filed: May 13, 1999

Related U.S. Application Data

[62] Division of application No. 08/982,589, Dec. 2, 1997, Pat. No. 5,923,239.

[51] Int. Cl.[7] ................................................ H02H 5/00
[52] U.S. Cl. ........................ 361/104; 361/118; 361/124
[58] Field of Search .................................. 361/104, 103, 361/118, 124, 38; 337/297

[56] References Cited

U.S. PATENT DOCUMENTS

| | | | |
|---|---|---|---|
| 3,358,363 | 12/1967 | Jacks et al. | 29/623 |
| 3,585,556 | 6/1971 | Hingorany et al. | 337/297 |
| 4,296,398 | 10/1981 | McGalliard | 337/297 |
| 4,394,639 | 7/1983 | McGalliard | 337/292 |
| 4,635,023 | 1/1987 | Oh | 337/163 |
| 5,099,219 | 3/1992 | Roberts | 337/297 |
| 5,456,942 | 10/1995 | Bebak et al. | 337/297 |
| 5,543,774 | 8/1996 | Lof | 337/297 |
| 5,552,757 | 9/1996 | Blecha et al. | 337/297 |
| 5,923,239 | 7/1999 | Krueger et al. | 337/297 |

*Primary Examiner*—Stephen W. Jackson
*Attorney, Agent, or Firm*—Wallenstein & Wagner, Ltd.

[57] ABSTRACT

A printed circuit board assembly comprising a printed circuit board having a plurality of conductive traces deposited on a surface thereof to define a plurality of electrical circuit geometries. A plurality of thin film fuses are deposited on the printed circuit board, each fuse providing circuit protection to one of the plurality of conductive traces.

19 Claims, 7 Drawing Sheets

PRINTED CIRCUIT BOARD ASSEMBLY HAVING AN INTEGRATED FUSIBLE LINK

CROSS REFERENCE TO RELATED APPLICATIONS

This application is a division of U.S. patent application Ser. No. 08/982,589, filed on Dec. 2, 1997, upon which a claim of priority is based, and which issued on Jul. 13, 1999 as U.S. Pat. No. 5,923,239.

TECHNICAL FIELD

The present invention is generally directed to a printed circuit board assembly having a thin film fuse directly integrated into the circuit geometry.

BACKGROUND OF THE INVENTION

Conventional printed circuit ("PC") boards generally comprise a laminar construction of an electrically insulating substrate, a conductive layer and an adhesive. The adhesive bonds the conductive layer to the insulating substrate. For example, a copper cladding covers a surface of the insulating substrate which is commonly formed from one of the following materials: FR-4 epoxy, ceramic, glass-epoxy mixtures, polyimides, melamine and electrically insulating polymers. Various techniques are employed by printed circuit board manufacturers to etch away portions of the conductive layer leaving behind conductive traces which define desired electrical circuit geometries.

In addition, various technologies have been employed to attach and interconnect discrete surface-mounted, electronic components, including fuses, to these conductive traces to form circuit modules, assemblies or sub-assemblies. These discrete surfaced-mounted electronic components are typically soldered or electrically connected to the conductive traces. In many applications today, however, miniaturization requirements drive the design of PC boards, including single PC board applications where planar board "real estate" can be at a minimum and in multi-board applications where a plurality of PC boards must be vertically stacked. Accordingly, there is a need for a PC board assembly having thin film electrical fuses directly integrated into the circuit geometry or conductive traces to provide protection to the defined circuit geometries.

The present invention is designed to meet this need, and solve these and other problems.

SUMMARY OF THE INVENTION

It is an object of the present invention to provide integrated circuit protection to the defined circuit geometries of a PC board assembly.

It is also an object of the present invention to provide a method for manufacturing a PC board assembly having integrated circuit protection.

In a first aspect of the present invention there is provided a PC board assembly comprising a conductive trace defining an electrical circuit geometry on a first surface of a PC board. A thin film fuse on the PC board electrically connects first and second portions of the conductive trace. The thin film fuse has a fusible link including a first conductive layer and a second conductive layer. The second conductive layer is comprised of a material other than a material comprising the first conductive layer.

In a second aspect of the present invention there is provided an electrical assembly comprising an electrically insulating substrate having a first and a second conductive trace on a first surface. The conductive traces are adapted to have an electrical component connected thereto. A fusible link is formed on the first surface of the substrate and electrically connects the first and the second conductive traces. The fusible link includes a first and second conductive layer, the second conductive layer being comprised of a material other than a material comprising the first conductive layer. A protective coating covers the fusible link.

In a third aspect of the present invention a method for manufacturing an electrical assembly having integrated circuit protection is provided. The electrical assembly includes an electrically insulating substrate having a conductive trace on a first surface thereof to define an electrical circuit geometry. The method comprises removing a portion of the conductive trace to expose the electrically insulating substrate, thus, forming first and second circuit traces. A first conductive layer is deposited on the exposed substrate and connects the first and second circuit traces. A second conductive layer is deposited on the first conductive layer to form a fusible link.

In a fourth aspect of the present invention, a method for manufacturing an electrical assembly having integrated circuit protection is provided. The method comprises conditioning the surface of an insulating substrate to make the substrate surface conducive to bonding with a conductive layer. A first conductive layer, i.e., a fusible element, is applied to the roughened surface of the insulating substrate. Conductive traces are laminated to the insulating substrate such that the fusible element electrically connects the conductive traces. A second conductive layer is applied to the first conductive layer to form a fusible link. Finally, a protective layer is applied to the fusible link.

In a final aspect of the present invention a method for manufacturing a printed circuit board assembly having integrated circuit protection is also provided. The printed circuit board assembly comprises an electrically insulating substrate having a first conductive layer attached to a surface of the substrate. The method for manufacturing comprises the steps of removing a portion of the conductive layer to define a circuit geometry. A second conductive layer is applied to the circuit geometry to form a fusible link. In the final step, a protective coating is applied to the fusible link.

Other features and advantages of the invention will be apparent from the following specification taken in conjunction with the following drawings.

BRIEF DESCRIPTION OF THE DRAWINGS

In order that the present invention may be understood, it will now be described by way of example, with reference to the accompanying drawings in which.

DETAILED DESCRIPTION OF THE PREFERRED EMBODIMENT

Figure 1:
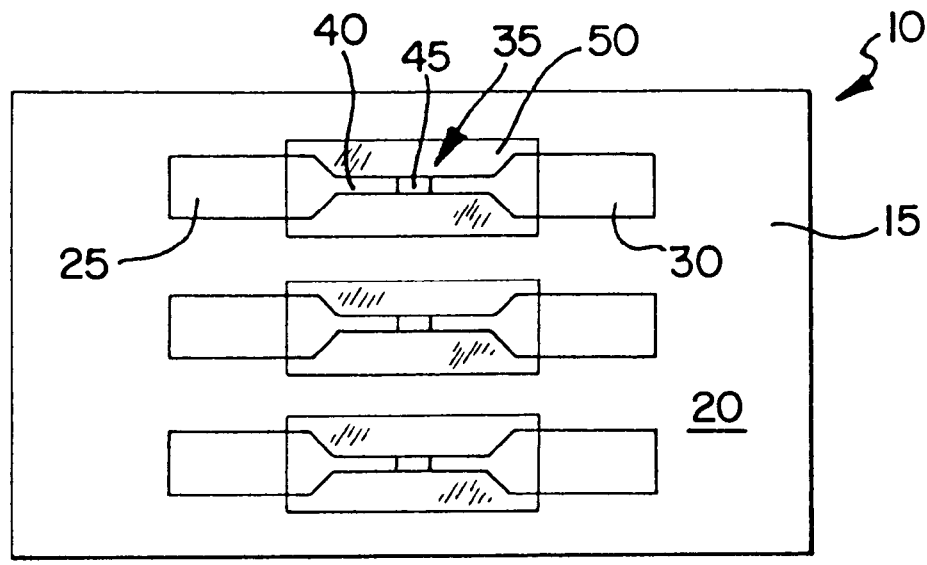
FIG. 1 is a top view of an electrical assembly having integrated circuit protection according to a first embodiment of the present invention.

While this invention is susceptible of embodiments in many different forms, there is shown in the drawings and will herein be described in detail, preferred embodiments of the invention with the understanding that the present disclosure is to be considered as an exemplification of the principles of the invention and is not intended to limit the broad aspects of the invention to the embodiments illustrated.

The present invention integrates a thin film fuse directly into the circuitry of a PC board. With reference to FIG. 1, an electrical assembly 10 according to the present invention includes an electrically insulating substrate 15 with a first surface 20. First and second conductive traces 25,30 are on the first surface 20 and are adapted to have additional electrical components connected thereto. A fusible link 35 is on the first surface 20 and electrically connect the first and second conductive traces 25,30. The fusible link 35 includes a first conductive layer 40 and a second conductive layer 45. The second conductive layer 45 is deposited on a surface of the first conductive layer 40 and is comprised of a material other than a material comprising the first conductive layer 40. A protective coating 50 covers the fusible link 35 to protect the fusible link 35 from impact and oxidation.

Figure 2:
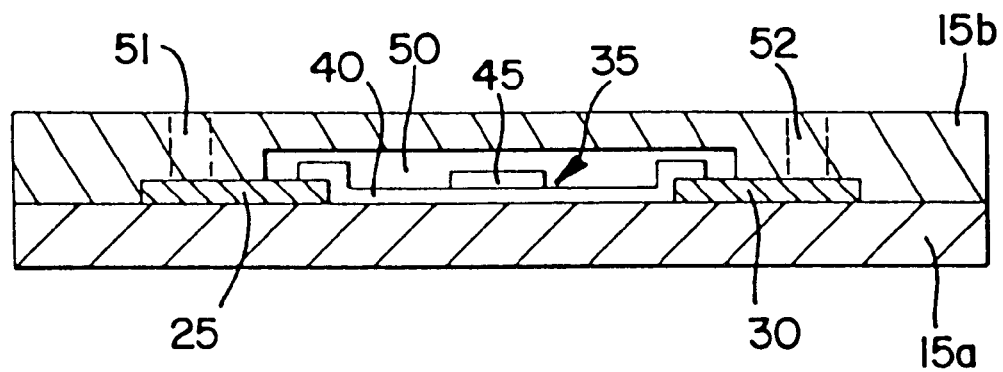
FIG. 2 is a side view of an electrical assembly having integrated circuit protection according to a second embodiment of the present invention.

FIG. 2 shows an electrical assembly 10 comprised of vertically stacked PC boards 15a, 15b. PC board 15a has integrated fuse protection on a surface thereof; i.e., conductive traces 25,30 electrically connected via fusible link 35. The fusible link comprises first and second conductive layers 40,45. Protective coating 50 covers the fusible link 35. PC board 15b is stacked vertically atop PC board 15a. Ultimately, the PC boards 15a,15b are laminated to form a single assembly. PC board 15b has apertures 51,52 which allow electrical access to the electronic components, including fusible link 35, connected to PC board 15a. It should be understood that the present invention contemplates an electrical assembly comprised of a plurality of vertically stacked PC boards such as shown in FIG. 2.

Two preferred methods for manufacturing an electrical assembly having a thin film fuse integrated directly into the circuitry of a PC board will be discussed. In the first preferred method, a portion of the existing circuitry is removed exposing the insulating substrate of the PC board. A thin film fuse is then built up on the insulating substrate using conventional plating techniques. This method will be referred to herein as the "direct deposit method." In the second preferred method, a thin film fuse can be integrated directly into the PC board by etching the fuse directly into the existing circuitry. This method will be referred to herein as the "direct etching method."

Embodiment Illustrated In FIGS. 3A–3K

Figure 3A:
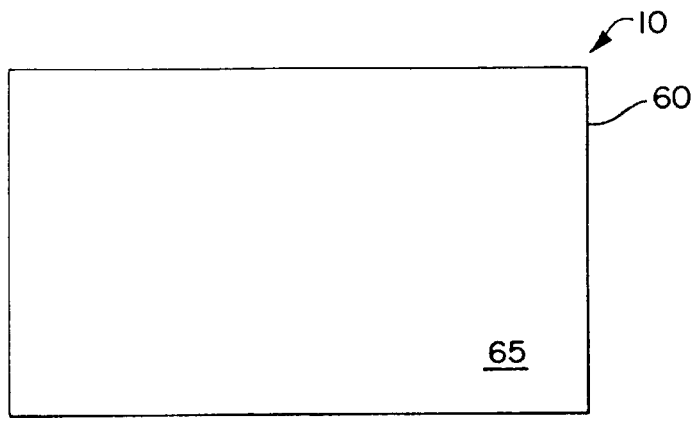
FIGS. 3A–3K illustrate a first embodiment of the direct deposit method for manufacturing an electrical assembly according to the present invention.
Figure 3B:
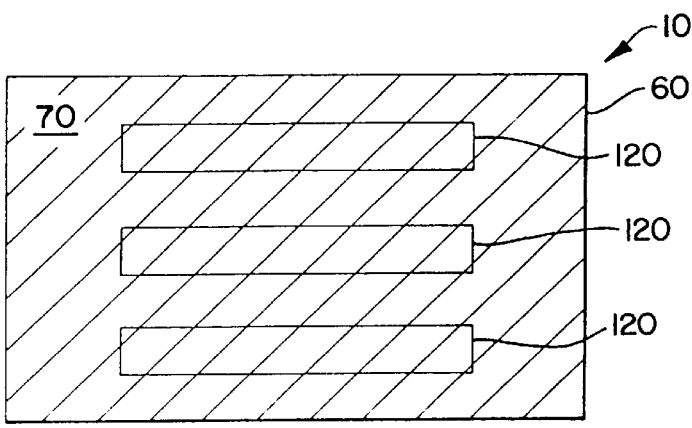

The various steps for manufacturing an electrical assembly according to a preferred embodiment of the direct deposit method will be described with reference to FIGS. 3A–3K. As illustrated in FIGS. 3A and 3B, a PC board 60 having a conductive clad surface 65 is covered with a photoresist material 70. Typically, the PC board 60 is a laminate of an electrically insulating substrate (e.g., ceramic, glass epoxy, electrically insulating polymers, and FR4 epoxy), an adhesive and a conductive foil. A plurality of conductive traces 120 are imaged onto the PC board 60 using a mask or photolithographic art work as is well known in the art. The unmasked photoresist material 71 forming the desired geometry of conductive traces 120 is cured.

Figure 3C:
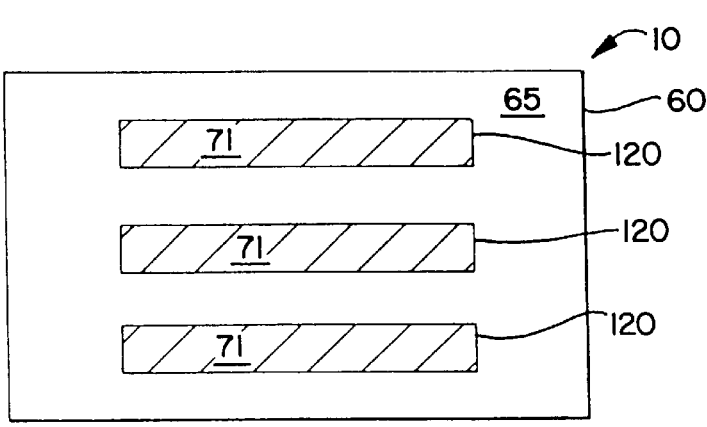
Figure 3D:
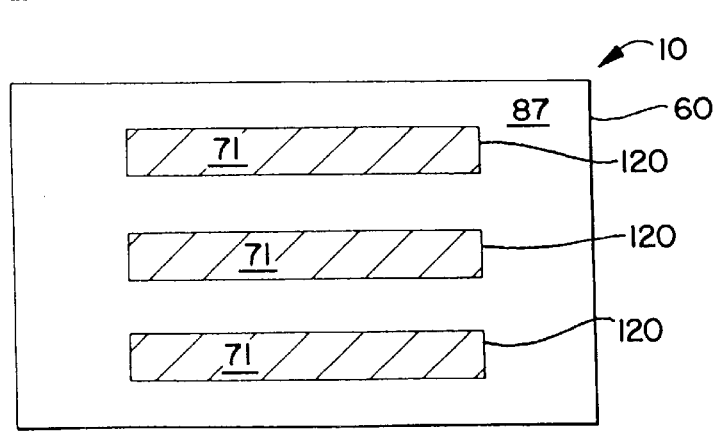

Referring to FIG. 3C, the cured photoresist material 71 is developed, removing the uncured photoresist material and exposing the conductive clad surface 65 defining the conductive traces 120. In the next step, illustrated in FIG. 3D, the exposed conductive clad surface 65 is etched away, preferably by subjecting the layer 65 to a ferric chloride solution, exposing an insulating substrate 87 of the PC board 60 and leaving behind the geometry of conductive traces 120 protected by cured photoresist 71.

Figure 3E:
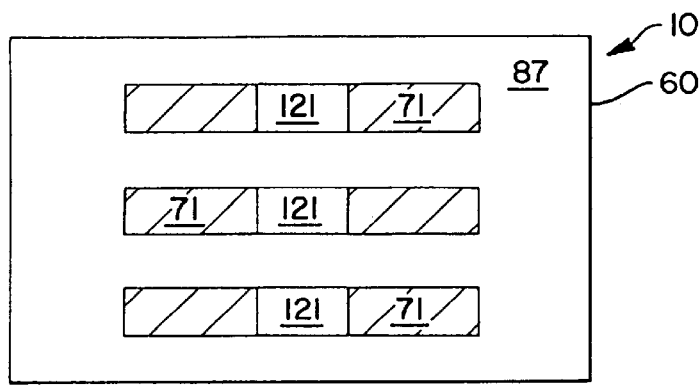
Figure 3F:
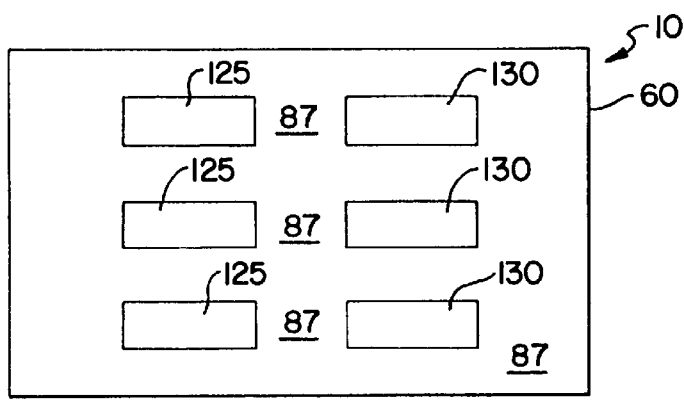

In FIG. 3E, portions of the cured photoresist 71 (approximately equal to the length of the fusible link) are stripped away exposing mid-portions 121 of the conductive traces 120. The exposed mid-portions 121 are etched away by subjecting the portions 121 to a ferric chloride solution, thus, exposing the electrically insulating substrate 87 between portions of the conductive traces 120. Since the fusible link will be created by depositing a conductive layer on the exposed insulating substrate 87 between portions of the conductive traces 120, it is important to make sure that this surface of the insulating substrate 87 is free from any adhesive. This will ensure a reliable connection between the deposited fusible link and the exposed insulating substrate 87. The remaining cured photoresist covering the conductive traces 120 is then removed, forming a plurality of first and second circuit traces 125,130 (FIG. 3F).

Figure 3G:
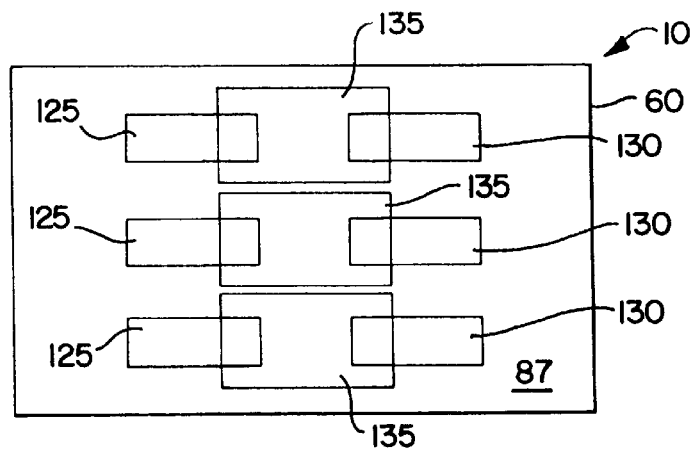

Referring to FIG. 3G, a first conductive layer 135 is deposited on the substrate 87 connecting the first and second circuit traces 125,130, respectively. In a preferred method, the first conductive layer 135 comprises copper and is plated onto the substrate using conventional electroless plating techniques.

Figure 3H:
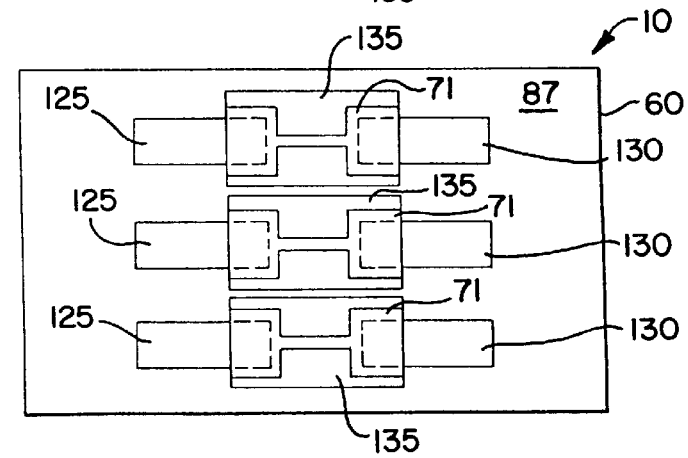
Figure 3I:
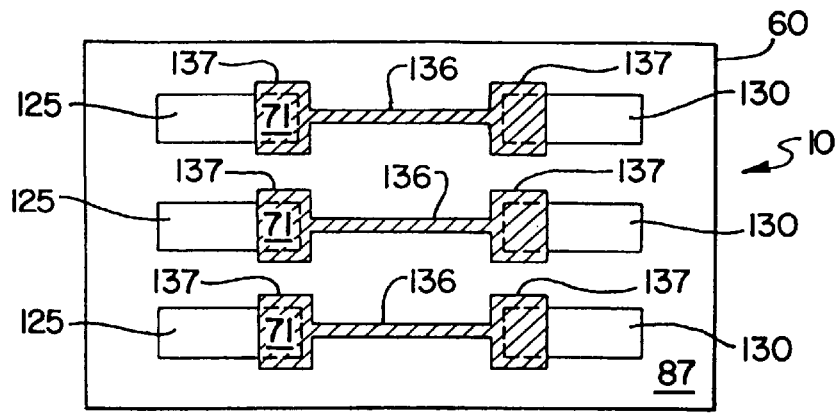
Figure 3J:
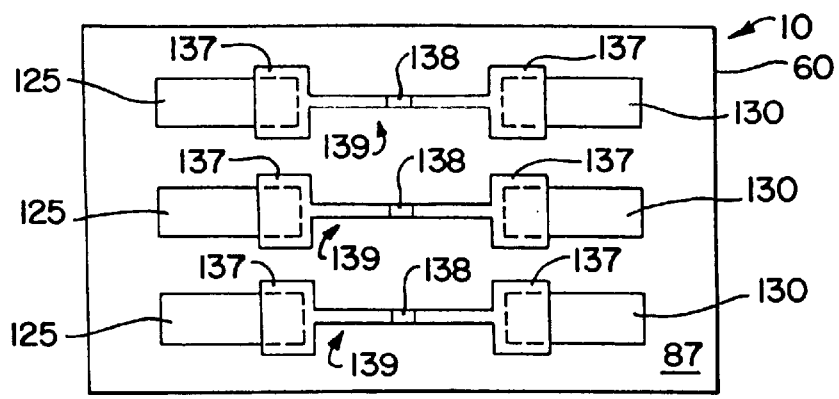
Figure 3K:
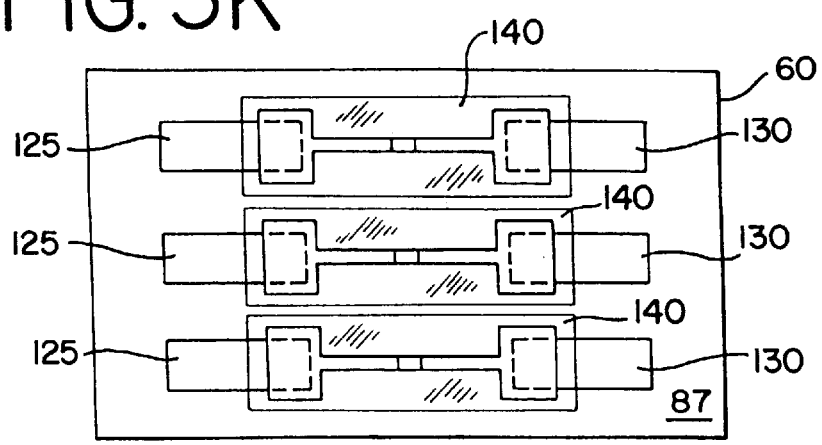

In the next step, the fusible link geometry is defined. This is accomplished in the same manner as defining the conductive traces (see FIGS. 3A–3D). Referring to FIGS. 3H–3J, a photoresist material 70 is applied to the first conductive layers 135. The fusible link geometry is imaged onto the photoresist material 70 using a mask or photolithographic art work as is well known in the art. The unmasked photoresist material 71 protecting the fusible link geometry is cured. The cured photoresist 71 is developed, removing the uncured photoresist material and exposing portions of the first conductive layers 135. The exposed portions of the first conductive layers 135 are etched away, preferably by a ferric chloride solution. The fusible link geometries protected by the cured photoresist material 71 are left behind (FIG. 3I).

In the preferred embodiment illustrated in FIG. 3I, the fusible link geometries comprise a thin fusible element 136 connecting terminal pads 137, which partially overlay the first and second conductive traces 125, 130, to ensure a reliable electrical connection, respectively. It should be understood that the fusible link geometry, including the overall dimensions, may vary according to the desired application and rating of the integrated fuse and electrical assembly.

With reference to FIG. 3J, portions of the cured photoresist material 71 protecting the thin fusible elements 136 are stripped away, exposing the first conductive layer 135. A second conductive layer 138, preferably tin or a tin/lead alloy is applied to the exposed portions of the thin fusible elements 136 forming fusible links 139. The remaining cured photoresist material is stripped away from the terminal pads 137 and the thin fusible element 136, exposing the first conductive layer 135. In the final step, illustrated in FIG. 3K, a protective coating 140 is applied to the fusible links 139. Preferably the protective coating is a polymeric material. A polycarbonate film is well suited for use as the protective coating 140.

The first conductive layer 135 has a thickness, $t_{cl}$. The circuit traces 125,130 have a thickness, $t_{ct}$. In the preferred embodiment where conductive layer 135 is electroless plated copper and circuit traces 125,130 are typically a copper foil, $t_{fl}$ is less than $t_{ct}$.

Embodiment Illustrated In FIGS. 4A–4E

Figure 4A:
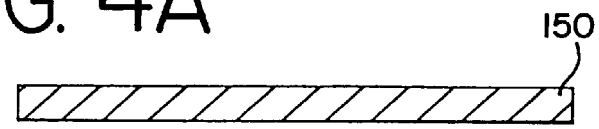
FIGS. 4A–4E illustrate a second embodiment of the direct deposit method for manufacturing an electrical assembly according to the present invention.
Figure 4B:
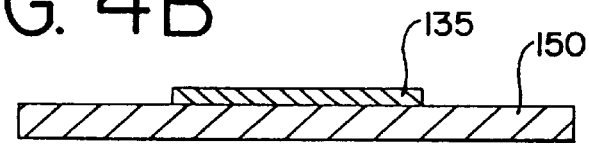

A second embodiment of the direct deposit method is described with reference to FIGS. 4A–4E. In this method, there is provided an insulating substrate 150. The surface of the insulating substrate is preconditioned or roughened to enhance plateability. The surface may be chemically conditioned by exposing it to $MnO_4$ or mechanically conditioned, e.g., sand blasting. A first conductive layer 135 is applied to the treated surface of the insulating substrate 150 (FIG. 4B). The conductive layer can be applied by any conventional technique; for example, lamination or electroless plating. Preferably, the first conductive layer 135 comprises electroless plated copper.

Figure 4C:
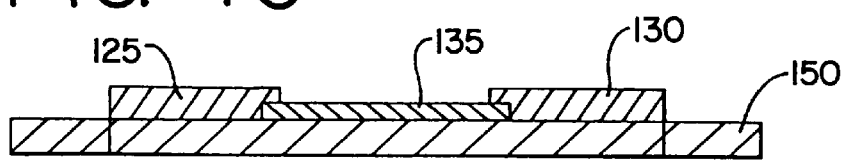
Figure 4D:
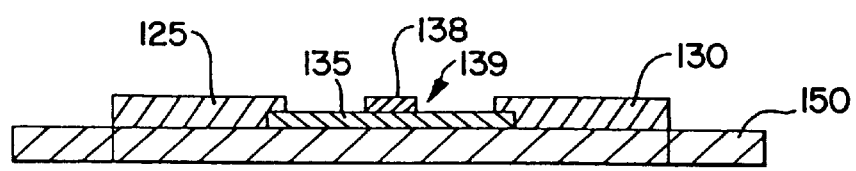
Figure 4E:
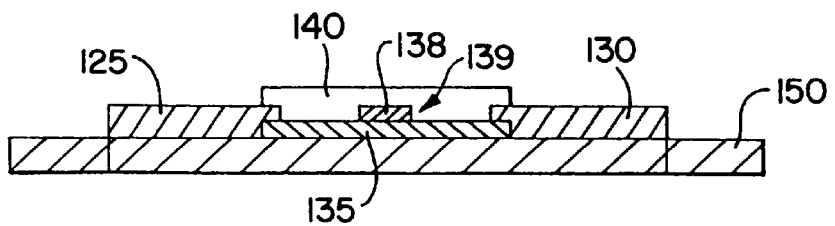

Referring to FIG. 4C, circuit traces 125,130 are laminated to the insulating substrate 150 such that the circuit traces 125,130 are electrically connected to the first conductive layer 135. A second conductive layer 138 is applied to the first conductive layer 135 to form a fusible link 139. (FIG. 4D). In the final step, illustrated in FIG. 4E, a protective coating 140 is applied to the fusible link 139 to protect the fusible link 139 from the formation of oxides and the application of mechanical stresses.

Embodiment Illustrated In FIGS. 5A–5F

Figure 5A:
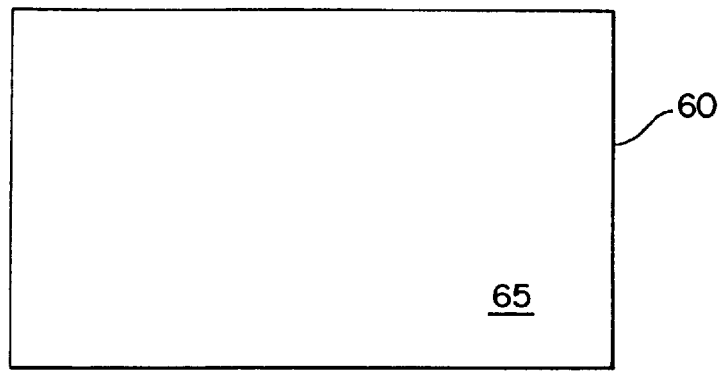
FIGS. 5A–5F illustrate a first embodiment of the direct etching method for manufacturing an electrical assembly according to the present invention.
Figure 5B:
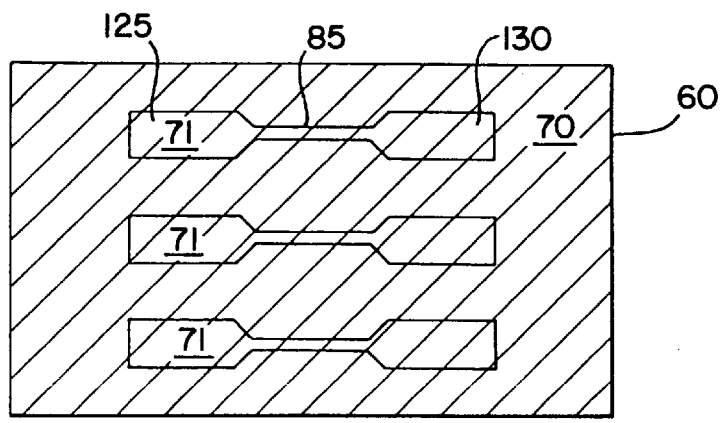

The various steps for manufacturing an electrical assembly according to the direct etching method will be described with reference to FIGS. 5A–5H. In FIG. 5A, the direct etching method is carried out on a conventional "virgin" PC board 60 having an outer, first conductive layer 65 without defined circuit geometry. Typically, the PC board 60 is a laminate of an electrically insulating substrate (e.g., ceramic, glass epoxy, electrically insulating polymers, and FR4 epoxy), an adhesive and a conductive foil. It should be understood by those having skill in the art, that the direct etching method may also be carried out on a PC board already having a defined circuit geometry.

In the direct etching method of the present invention, the circuit geometry is etched into the first conductive layer 65 using conventional photolithographic techniques. First, referring to FIG. 5B, the PC board 60 is covered with a photoresist material 70. Circuit traces 125,130 and fuse element 85 are imaged onto the board 60 using a mask or photolithographic art work as explained above. The unmasked photoresist material 71 (i.e., the material protecting circuit traces 125,130 and the fuse element 85) is cured.

Figure 5C:
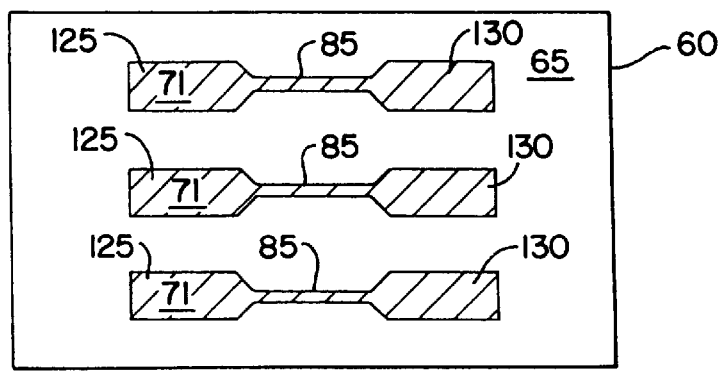
Figure 5D:
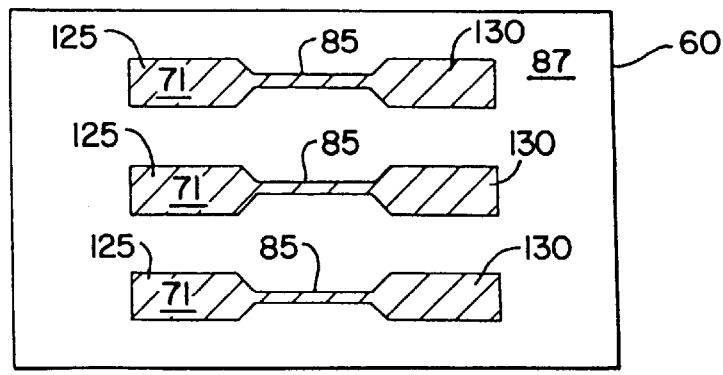

With reference to FIG. 5C, the cured photoresist material 71 is developed and the uncured photoresist material is removed, exposing the first conductive layer 65 of the PC board 60. The cured photoresist material 71 defines and protects the circuit traces 125,130 and the fusible element 85 during further processing steps. The exposed first conductive layer 65 of the PC board 60 is etched away, preferably by subjecting the exposed first conductive layer 65 to a ferric chloride solution, exposing the insulating substrate 87 of the PC board 60 (FIG. 5D).

Figure 6:
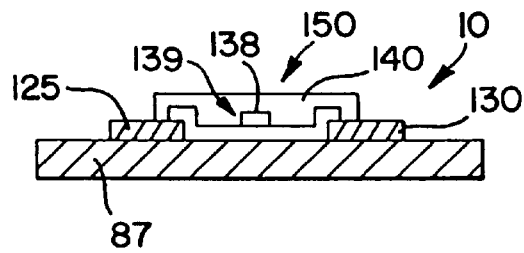
FIG. 6 is a front view of an electrical assembly manufactured according to the direct deposit method of the present invention.
Figure 7:
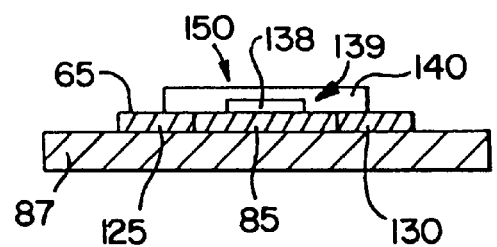
FIG. 7 is a front view of an electrical assembly manufactured according to the direct etching method of the present invention.

Contrary to the electrical assembly manufactured according to the direct deposit method, in the direct etching method, the circuit traces 125,130 and the fusible element 85 are formed from the same structure, i.e., first conductive layer 65 (compare FIGS. 6 and 7). In conventional PC boards this structure is generally a metallic foil, typically copper. To induce blowing of the fuse, fuse element 85 will preferably have a width less than the width of the circuit traces 125,130. The dimensions of the fuse element 85 and the circuit traces 125,130 can be controlled during the imaging step explained above in conjunction with FIG. 5B.

A second conductive layer 138 is applied to the fuse element 85 to create a fusible link 139. The application of the second conductive layer 138 to the fuse element 85 lowers the melting point temperature of the fusible link 139 below that of the circuit traces 125,130. This is commonly known as the M-effect.

In a preferred embodiment where the circuit traces 125,130 comprise copper foil and the second conductive layer 138 comprises solder, tin, lead or alloys thereof, the difference in the melting point temperature between the conductive traces 125,130 and the fusible link 139 is approximately 1250° F. By lowering the melting point temperature of the fusible link 139, the rating of the integrated fuse can be controlled. In addition, carbon tracking and charring which could occur due to the presence of an adhesive from the PC board can be avoided.

Figure 5E:
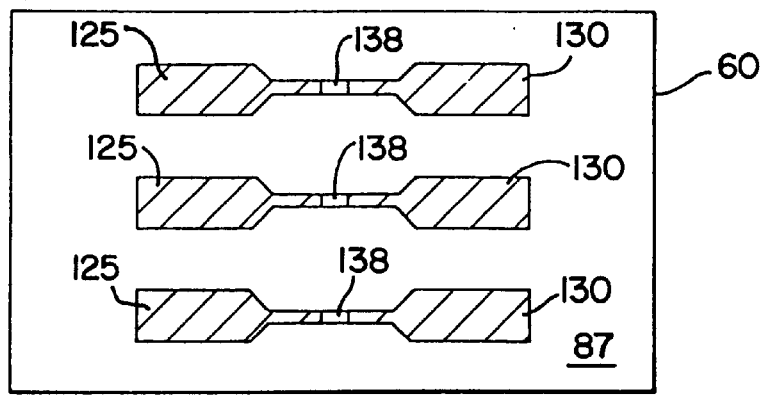
Figure 5F:
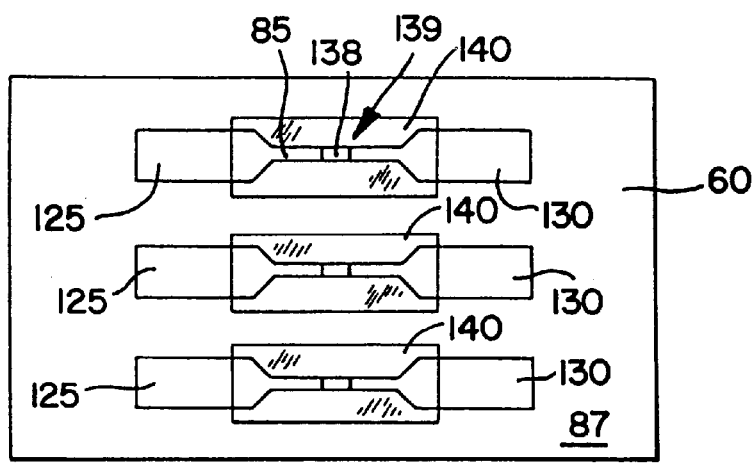

As shown in FIG. 5E, the second conductive layer 138 is applied to the fuse element 85 by stripping away a portion of the cured photoresist material 71 from the fuse element 85 to expose the first conductive layer 65. The second conductive layer 138 is then applied to the exposed portion of the first conductive layer 65 by any conventional deposition method (e.g., vapor deposition, sputtering, plating) to form the fusible link 139.

As mentioned above, in a preferred embodiment the fusible link 139 includes the fuse element 85 and the second conductive layer 138. In order to lower the melting point temperature of the fusible link 139, the second conductive layer 138 is comprised of a material other than a material comprising the first conductive layer 65, e.g., the second conductive layer 138 is solder, tin, lead or alloys thereof and the first conductive layer 65 is comprised of a metal selected from the group consisting of copper, silver, nickel, titanium, aluminum and alloys thereof.

Finally, the remaining cured photoresist material 71 is stripped from the circuit traces 125,130 and the fuse element 85 and a protective coating 140 is deposited over the fusible link 139 to protect the link 139 from impact and oxidation. Preferably, the protective coating 140 is a polymeric material. A polycarbonate film is well suited for use as a protective coating 140.

FIG. 6 illustrates a front view of an electrical assembly 10 made according to the direct deposit method of the present invention. FIG. 7 illustrates a front view of an electrical assembly 10 made according to the direct etching method of the present invention. While only a single integrated fuse 150 is shown in FIGS. 6 and 7, and while the various process steps in FIGS. 3A–3K, FIGS. 4A–4E and FIGS. 5A–5F are shown being carried out on a limited number of integrated fuses, it should be understood to those having skill in the art that the electrical assemblies 10 of the present invention may have a plurality of integrated fuses.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What we claim is:

1. A method for manufacturing an electrical assembly comprised of an electrically insulating substrate having a conductive trace on a first surface thereof to define an electrical circuit geometry, the method comprising the following steps:

removing a portion of the conductive trace to expose the electrically insulating substrate and form first and second circuit traces;

depositing a first conductive layer on the exposed substrate, the first conductive layer electrically connecting the first and second circuit traces; and depositing a second conductive layer on the first conductive layer to form a fusible link.

2. The method of claim 1 wherein the first conductive layer is comprised of a material other than a material comprising the second conductive layer.

3. The method of claim 1 including the step of applying a protective coating to the fusible link.

4. The method of claim 1 wherein the step of removing a portion of the conductive trace to expose the electrically insulating substrate and form first and second circuit traces further includes the steps of:

masking first and second portions of the conductive trace leaving a portion of the conductive trace unmasked;

removing the unmasked portion of the conductive trace to expose the insulating substrate; and removing the masking from the first and second portions of the conductive trace to define the first and second circuit traces.

5. The method of claim 1 wherein the step of depositing a first conductive layer on the exposed substrate to electrically connect the first and second circuit traces further includes the steps of:

applying a conductive material to the exposed substrate and portions of the first and second circuit traces;

masking the conductive material;

leaving a portion of the conductive material unmasked; and removing the unmasked conductive material to define first and second terminal pads and a fuse element.

6. The method of claim 1, wherein the first conductive layer is deposited on the exposed substrate by electroless plating.

7. The method of claim 1, wherein the first conductive layer comprises copper.

8. The method of claim 1 wherein the step of depositing a second conductive layer on the first conductive layer to form a fusible link further includes the steps of:

masking the first conductive layer and portions of the first and second circuit traces;

exposing a portion of the first conductive layer;

depositing the second conductive layer on the exposed portion of the first conductive layer; and removing the masking from the first conductive layer and the portions of the first and second circuit traces.

9. A method for manufacturing an electrical assembly comprising an electrically insulating substrate and an integrated fuse, the method comprising the steps of:

conditioning the insulating substrate;

depositing a first conductive layer on the insulating substrate;

electrically connecting a first and a second conductive trace to the first conductive layer; and applying a second conductive layer to the first conductive layer to form a fusible link.

10. The method of claim 9 further comprising the step of covering the fusible link with a protective coating.

11. The method of claim 9, wherein the first and second conductive traces are deposited on the insulating substrate, a portion of each of the first and second conductive traces being deposited on the first conductive layer.

12. The method of claim 11, wherein the first and second conductive traces have a thickness greater than a thickness of the first conductive layer.

13. The method of claim 9, wherein the first conductive layer is deposited on the insulating substrate by electroless plating.

14. The method of claim 13, wherein the first conductive layer is copper.

15. A method for manufacturing an electrical assembly comprised of an electrically insulating substrate having an electrical circuit geometry defined on a surface thereof, the method comprising the following steps:

providing an electrically insulating substrate having a first conductive layer attached to a first surface, the first conductive layer defining a desired circuit geometry;

creating first and second circuit traces in the first conductive layer;

creating a fusible element in the first conductive layer, the fusible element electrically connecting the first and second circuit traces; and applying a second conductive layer to the first conductive layer to form a fusible link.

16. The method of claim 15, wherein the first conductive layer is comprised of a material selected from a group comprised of copper, silver, nickel, titanium, aluminum and alloys thereof.

17. The method of claim 15, wherein the second conductive layer is comprised of a material selected from a group comprised of tin, solder, lead and alloys thereof.

18. The method of claim 15, wherein the steps of creating the first and second circuit traces and the fusible element is carried out by:

masking portions of the first conductive layer; and etching away the unmasked portions of the first conductive layer.

19. The method of claim 15 wherein the first and second circuit traces have a width, $W_1$, and the fusible element has a width, $W_2$, wherein $W_1$ is greater than $W_2$.

* * * * *